United States Patent
Eilert

(10) Patent No.: US 8,037,231 B2
(45) Date of Patent: Oct. 11, 2011

(54) MEMORY ARCHITECTURE FOR SEPARATION OF CODE AND DATA IN A MEMORY DEVICE

(75) Inventor: Sean Eilert, Penryn, CA (US)

(73) Assignee: Intel Corporation, Santa Clara, CA (US)

( * ) Notice: Subject to any disclaimer, the term of this patent is extended or adjusted under 35 U.S.C. 154(b) by 593 days.

(21) Appl. No.: 11/605,556

(22) Filed: Nov. 28, 2006

(65) Prior Publication Data

US 2008/0123421 A1 May 29, 2008

(51) Int. Cl.
  G06F 12/00 (2006.01)
  G11C 11/34 (2006.01)
  H04L 1/18 (2006.01)

(52) U.S. Cl. ........ 711/103; 711/149; 711/153; 711/173; 365/185.33; 365/185.09; 365/185.24; 714/48; 714/52

(58) Field of Classification Search ............ 711/103, 711/173, 149, 153; 365/185.33, 185.09, 365/185.24; 714/48, 52
See application file for complete search history.

(56) References Cited

U.S. PATENT DOCUMENTS

| | | | | |
|---|---|---|---|---|
| 2003/0110361 A1* | 6/2003 | Kanehira et al. | | 711/154 |
| 2004/0177229 A1* | 9/2004 | March et al. | | 711/173 |
| 2004/0206982 A1* | 10/2004 | Lee et al. | | 257/200 |
| 2005/0204091 A1* | 9/2005 | Kilbuck et al. | | 711/103 |
| 2005/0281095 A1* | 12/2005 | Eilert et al. | | 365/189.12 |
| 2006/0135208 A1* | 6/2006 | Lee | | 455/558 |
| 2006/0224789 A1* | 10/2006 | Cho et al. | | 710/52 |
| 2006/0285396 A1* | 12/2006 | Ha | | 365/185.33 |
| 2007/0118713 A1* | 5/2007 | Guterman et al. | | 711/170 |
| 2007/0153575 A1* | 7/2007 | Cohen | | 365/185.11 |

OTHER PUBLICATIONS

Toshiba "NAND vs. NOR Flash Memory Technology Overview", updated Apr. 25, 2006, pp. 4.
Samsung "Multi-Chip Package Technology", printed Aug. 2006, pp. 4.
Micron "Micron's Multichip Packages", Mar. 27, 2006, pp. 2.
Intel, "Migration Guide for Intel StrataFlash Wireless memory (L18) to Intel StrataFlash Cellular Memory (M18)," Application Note 822, Oct. 2006, pp. 22.
Intel, Intel StratFlash Cellular Memory (M18), Developer's Manual, Nov. 2006, pp. 64.

* cited by examiner

Primary Examiner — Kevin Ellis
Assistant Examiner — Mehdi Namazi
(74) Attorney, Agent, or Firm — Trop, Pruner & Hu, P.C.

(57) ABSTRACT

Code, data, and/or other information types, may be isolated from one another and stored in distinct regions within the memory array of a nonvolatile memory. The distinct regions in memory may have corresponding read/write interfaces that are optimized for each information type.

19 Claims, 4 Drawing Sheets

MEMORY ARCHITECTURE FOR SEPARATION OF CODE AND DATA IN A MEMORY DEVICE

FIELD

Embodiments described herein relate to the storage of data in memory devices, and more specifically, to storage of code and data information types in a nonvolatile memory array.

BACKGROUND

Nonvolatile memories may be used to store numerous disparate code and data types. Usage patterns for these data types have different characteristics that may affect the memory device in which they are stored in different ways.

For example, a typical flash memory device may store both execute in place (XIP) code as well as multimedia data. XIP code is typically infrequently updated and frequently read. Thus, XIP code can tolerate slow in-system write performance, requires fast, deterministic initial access, and tends to induce and be affected by read disturb mechanisms. Multimedia data, on the other hand, is typically frequently updated and infrequently read. Thus, multimedia data can tolerate slow and/or nondeterministic initial access times, requires high performance writes, and tends to induce and be affected by charge loss/gain mechanisms.

FIG. 1 is a graph (100) illustrating the initial cell state distribution for code and data. The X-axis (104) indicates the memory cell state, and the Y-axis (102) indicates the fraction of memory cells in a given state. When code and data are initially written to a memory device, the cell states are clearly defined in State A (106) and State B (108). A relatively large separation (110) exists between those cells in state A and state B, and thus it is relatively easy to detect the difference between state A and state B when reading the memory cell(s). Initially, this is true regardless of the type of data stored in the memory cell.

However, over time the XIP code may be infrequently refreshed and frequently read, as described above. This may cause disturbs on the states of the data stored in memory, which may cause the state distribution for code cells to shift to the right. Similarly, multimedia data may be frequently rewritten and infrequently read, causing a different type of memory disturb to occur. These disturbs may cause the state distribution for the data cells to shift to the left.

FIG. 2 is a graph (200) illustrating the cell state distribution for code and data after cell state disturbs have occurred. Due to the disturbs, the cell state distributions for cells in state A (206) and state B (208) have widened, and may overlap (210). Thus, it can be very difficult to identify a proper reference placement in order to discern the difference between states. This may lead to errors when performing a read of the cells.

BRIEF DESCRIPTION OF THE DRAWINGS

A better understanding of embodiments of the present invention can be obtained from the following detailed description in conjunction with the following drawings, in which.

DETAILED DESCRIPTION

In the following description, for purposes of explanation, numerous details are set forth in order to provide a thorough understanding of embodiments of the present invention. However, it will be apparent to one skilled in the art that these specific details are not required in order to practice the present invention as hereinafter claimed.

Throughout the description, similar numbers will be used to refer to similar elements in the figures.

Embodiments described herein relate to the storage of information in a nonvolatile memory device. Multiple types of information may be stored in a memory device, including code (i.e., executable program code) that is infrequently written and frequently read and data (i.e., text, image, sound, or other multimedia data) that is frequently written and infrequently read. While code-type information and data-type information are described herein, embodiments are not limited thusly, and may also extend to other types of information that may be stored in non-volatile memory devices.

According to some embodiments, code and data may be isolated from one another and stored in distinct regions within a nonvolatile memory device's memory array.

Figure 3:
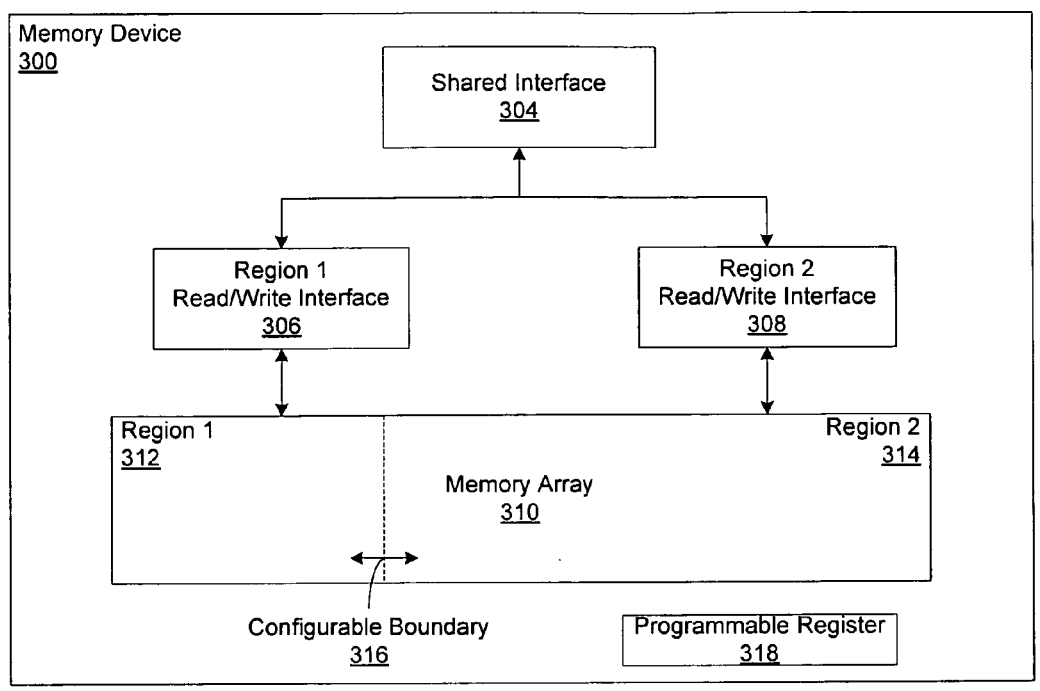
FIG. 3 is an illustration of a memory device according to some embodiments.

FIG. 3 illustrates a nonvolatile memory device (300) according to some embodiments. In some embodiments, the nonvolatile memory device (300) may be a NAND or a NOR-type flash memory device.

The memory device (300) includes a memory array (310). The memory array (310) is comprised of a plurality of memory cells to store information. In some embodiments, the memory array may be partitioned into two or more regions, such as region 1 (312) and region 2 (314). These regions may be defined by one or more configurable boundaries (316). Each region may store a different type of information. For example, region 1 (312) may be used to store code information, while region 2 (314) may be used to store data information.

The regions (312, 314) defined by the configurable boundary (316) may be set up using a programmable register (318). The programmable register may be a one-time programmable register, or may be a reprogrammable nonvolatile register.

In some embodiments, the regions may be defined on a partition basis. For example, for a memory device having eight partitions, the programmable register may be used to define three partitions as code partitions and five partitions as data partitions. In other embodiments, the regions may be defined on a block basis or by user-defined address ranges.

Each region may have its own dedicated read/write interface. Thus, region 1 (312) may have a region 1 read/write interface (306), and region 2 (314) may have a region 2 read/write interface (308). This allows read/write operations to occur simultaneously in both regions.

In some embodiments, one interface (306) may be a read/write interface that is coupled to both regions, while the second interface (308) may be a read-only interface coupled to one region. In this case, writes to both regions will occur via the read/write interface, while reads to one region will occur via the read/write interface and reads to the other region will occur via the read-only interface.

Each read/write interface may be optimized for the characteristics of the information type it supports. For example, where region 1 (312) is a code storage region, the region 1 read/write interface (306) may be optimized to have short read latencies, a fast factory programming mode with slower in-system programming, a read cache, and single cell error correction code (ECC). Similarly, where region 2 (314) is a data storage region, the region 2 read/write interface (308) may be optimized to have long read latencies, high write bandwidth, multi-cell ECC, wear leveling capability, and background refresh capability. Other optimizations may be made to the read/write interfaces as well. Region 1 (312) and region 2 (314) may also have a different reference level or threshold voltage ($V_T$).

Error correction may be optimized independently for each region as well. A code region may, for example, utilize a Hamming scheme, which is a fast, but less effective error detection and correction scheme. A data region may, for example, use a Reed-Solomon scheme, which is slower, but more effective.

Each region's read/write interface may be coupled to a shared interface (304). The shared interface may have both shared and independent characteristics. The shared interface may include, for example, shared address and data I/O signals used for both regions. The shared interface may, in some embodiments, include separate chip enable signals for each region.

Figure 1:
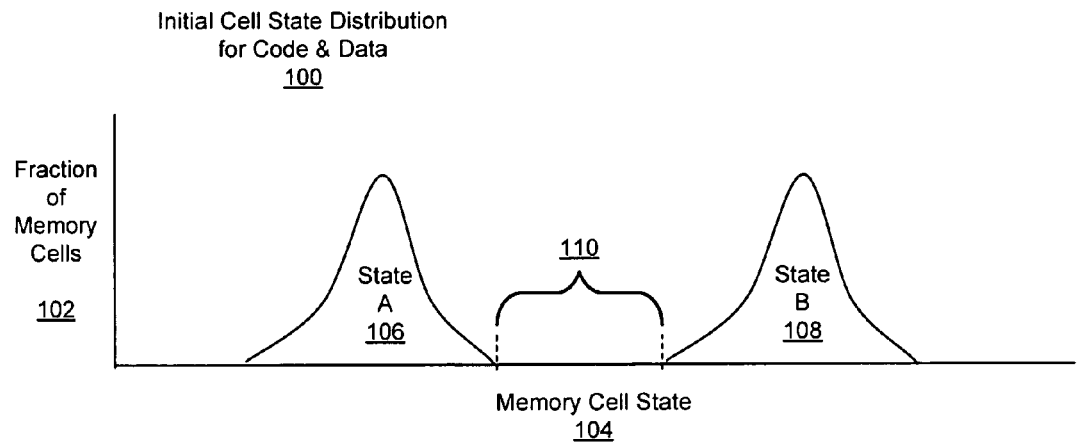
FIG. 1 is a graph illustrating an initial cell state distribution for code and data.
Figure 2:
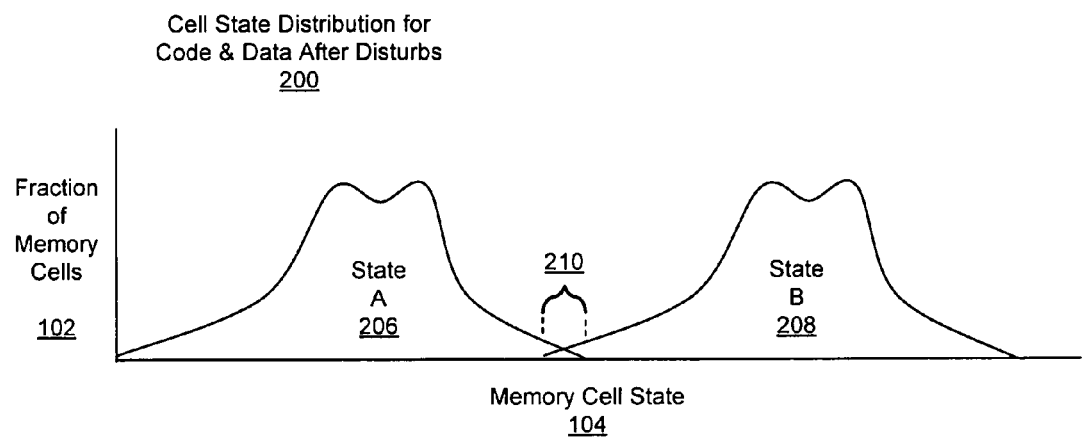
FIG. 2 is a graph illustrating a cell state distribution for code and data after cell disturbs.
Figure 4:
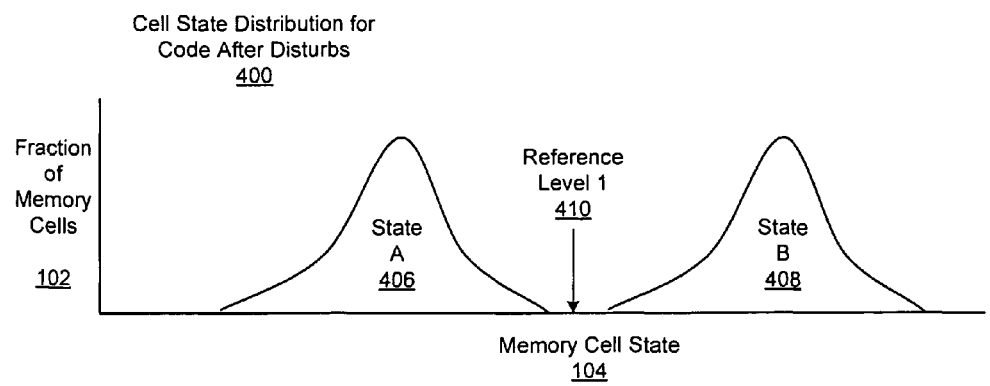
FIG. 4 is a graph illustrating a cell state distribution for code after cell disturbs.

FIG. 4 is a graph (400) illustrating the cell state distribution for code stored in a separate region of the memory array after disturbs. The X-axis (104) indicates the memory cell state, and the Y-axis (102) indicates the fraction of memory cells in a given state. Over time, the code information stored in the cells may be infrequently refreshed and frequently read, thus causing disturbs on the states of the data stored in memory, which may cause the state distribution (406, 408) for code cells to shift to the right as compared to FIG. 1. Because the code cells are stored in a separate part of the array from data cells, the code cells are all affected in a similar manner by disturbs. Thus, the cell states (406, 408) remain separated and a first reference level (410) may be chosen to accurately discern the difference between a code cell in state A (406) and a code cell in state B (408).

Figure 5:
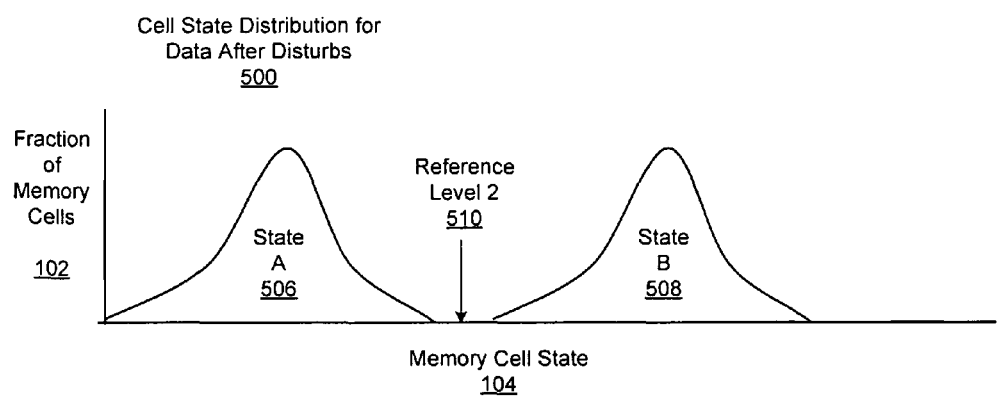
FIG. 5 is a graph illustrating a cell state distribution for data after cell disturbs.

FIG. 5 is a graph (500) illustrating the cell state distribution for data stored in a separate region of the array after cell state disturbs. Over time, data information stored in the cells may be frequently rewritten and infrequently read, causing disturbs. These disturbs may cause the state distribution (506, 508) for the data cells to shift to the left as compared to FIG. 1. Because the data cells are stored in a separate part of the array from code cells, the data cells are all affected in a similar manner by disturbs. Thus, the cell states (506, 508) remain separated and a second reference level (510) may be chosen to accurately discern the difference between a data cell in state A (506) and a data cell in state B (508).

The reference levels for different regions may be different. For example, the reference level for a code region may be different than that of a data region, as illustrated in FIGS. 4 and 5.

Figure 6:
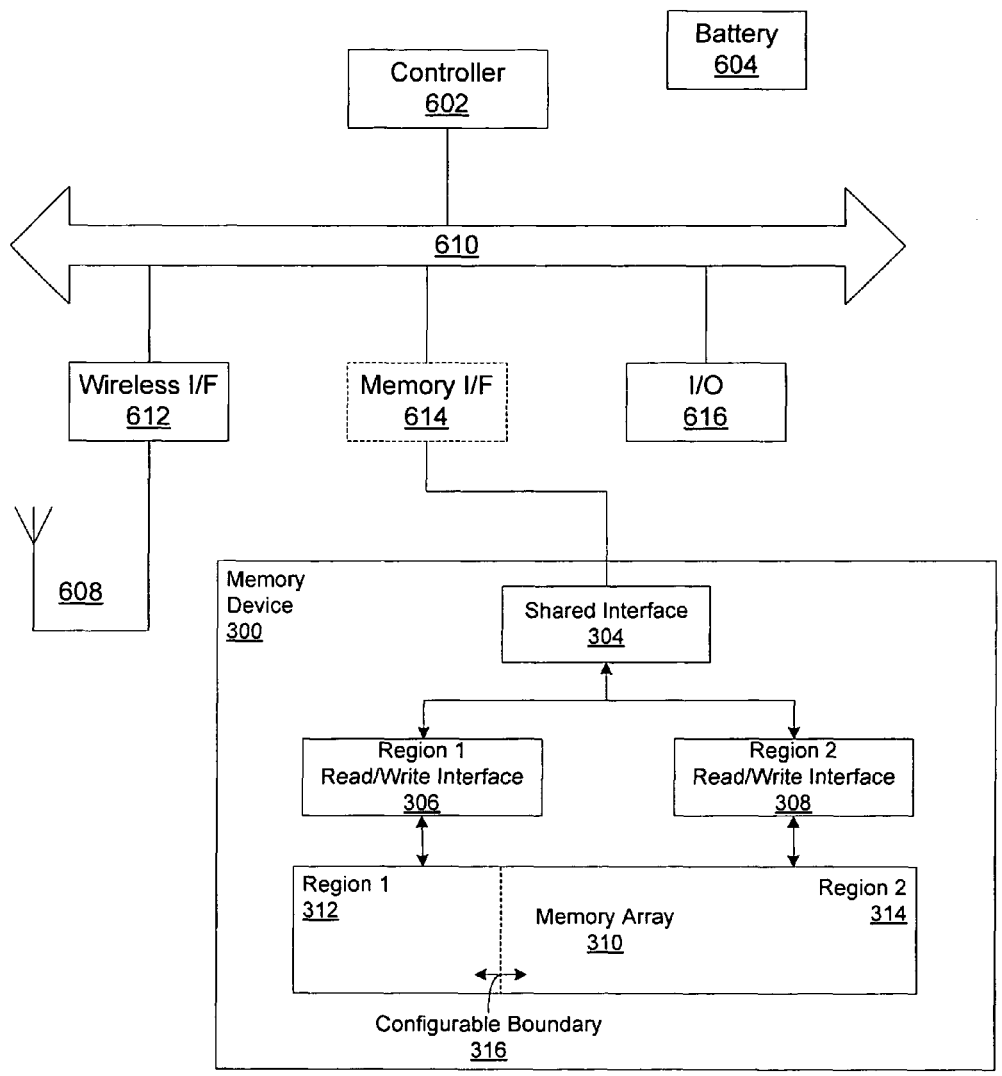
FIG. 6 is an illustration of a system according to some embodiments.

FIG. 6 is a block diagram of a system according to one embodiment of the present invention. The system may be powered by a battery (604) or may be powered with another type of power supply. The system may include a bus (610) which communicates with a controller (602). The controller (602) may be a microcontroller, one or more microprocessors, a digital signal processor (DSP), or another type of controller.

A variety of input/output (I/O) devices (616) may be coupled to the bus (610). The I/O devices may include items such as a display, keyboard, mouse, touch screen, or other I/O devices. A wireless interface (612) may also be coupled to the bus (610). The wireless interface (612) may enable cellular or other wireless communication between the system and other devices. In some embodiments, the wireless interface (612) may include a dipole antenna or other antenna (608).

The system also includes a nonvolatile memory device (300), such as the memory device described above with respect to FIG. 3. The memory device may be built into the system, or may be part of a removable storage medium, such as a card form factor, that may be inserted into an optional memory interface (614).

The memory device (300) includes a shared interface (304) to access the memory array (310). The shared interface may include a shared address and/or data I/O busses.

The memory array (310) may be divided into two or more regions (312, 314) having a configurable boundary (316). Each region (312, 314) may be used to store a different type of information. For example, region 1 (312) may be used to store code information, while region 2 (314) is used to store data information.

Each region may be coupled to a separate dedicated read/write interface (306, 308). Each region's read/write interface may have different characteristics, as described above. Each region's read/write interface (306, 308) is further coupled to the shared interface (304).

Thus, a memory architecture enabling separation of code and data in a memory device are disclosed in various embodiments. In the above description, numerous specific details are set forth. However, it is understood that embodiments may be practiced without these specific details. In other instances, well-known circuits, structures, and techniques have not been shown in detail in order not to obscure the understanding of this description. Embodiments have been described with reference to specific exemplary embodiments thereof. It will, however, be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

I claim:

1. An apparatus comprising:
    a first physical memory region to rewriteably store a first type of information; and
    a second physical memory region to rewriteably store a second type of information, wherein the first physical memory region and the second physical memory region are located on a memory device;
    a first read/write device, coupled to and dedicated to the first physical memory region, to read from said first physical memory region and to write to said first physical memory region;
    a second read/write device coupled to the second physical memory region, to read from said second physical memory region and to write to said second physical memory region, said first and second read/write devices to enable simultaneous read/write operations in both regions; and
    a shared interface coupled to the first read/write device and the second read/write device.

2. The method of claim 1, wherein the first type of information is code.

3. The method of claim 2, wherein the second type of information is data.

4. The apparatus of claim 1, further comprising a register to define the first physical memory region and the second physical memory region.

5. The apparatus of claim 4, wherein the register is a one-time programmable register.

6. The apparatus of claim 4, wherein the register is a reprogrammable nonvolatile register.

7. The apparatus of claim 1, wherein the shared interface includes a first chip enable signal corresponding to the first physical memory region and a second chip enable signal corresponding to the second physical memory region.

8. The apparatus of claim 1, wherein the first physical memory region includes cells having a first reference level and the second physical memory region includes cells having a second reference level.

9. The apparatus of claim 1, wherein the first physical memory region and the second physical memory region each comprise a number of memory partitions.

10. The apparatus of claim 1, wherein the memory device is a flash memory device.

11. A system comprising:
an interconnect;
a controller coupled to the interconnect; and
a memory device coupled to the interconnect, wherein the memory device includes a first physical memory region to rewriteably store a first type of information and a second physical memory region to rewriteably store a second type of information, wherein the memory device further includes a first read/write device, coupled to and dedicated to the first physical memory region, to read from said first physical memory region and to write to said first physical memory region, a second read/write device coupled to the second physical memory region, to read from said second physical memory region and to write to said second physical memory region, said first and second read/write devices to enable simultaneous read/write operations in both regions, and a shared interface coupled to the first read/write device and the second read/write device.

12. The system of claim 11, wherein the memory device is a flash memory device.

13. The system of claim 11, wherein the shared interface includes a first chip enable signal corresponding to the first physical memory region and a second chip enable signal corresponding to the second physical memory region.

14. A flash memory device comprising:
a memory array divided into at least two regions, wherein a first region is to store code-type information and a second region is to store data-type information;
a first read/write device coupled to and dedicated to the first region;
a second read/write device coupled to the second region, said first and second read/write devices to enable simultaneous read/write operations in both regions; and
a shared interface coupled to the first read/write device and the second read/write device.

15. The flash memory device of claim 14, wherein the first read/write device includes a read cache.

16. The flash memory device of claim 15, wherein the first read/write device further includes single cell error correction capability.

17. The flash memory device of claim 14, wherein the second read/write device includes wear leveling capability.

18. The flash memory device of claim 17, wherein the first read/write device further includes multi-cell error correction capability.

19. The flash memory device of claim 14, wherein the first region includes cells having a first reference level and the second region includes cells having a second reference level.

* * * * *

UNITED STATES PATENT AND TRADEMARK OFFICE
CERTIFICATE OF CORRECTION

| | | |
|---|---|---|
| PATENT NO. | : 8,037,231 B2 | Page 1 of 1 |
| APPLICATION NO. | : 11/605556 | |
| DATED | : October 11, 2011 | |
| INVENTOR(S) | : Sean Eilert | |

It is certified that error appears in the above-identified patent and that said Letters Patent is hereby corrected as shown below:

Col. 5, line 28 - "…inforniation" should be --…information…--

Signed and Sealed this
Sixth Day of March, 2012

David J. Kappos
*Director of the United States Patent and Trademark Office*